United States Patent [19]

Sadamori et al.

[11] Patent Number: 4,966,669
[45] Date of Patent: Oct. 30, 1990

[54] VACUUM-FILM-FORMING APPARATUS AND METHOD

[75] Inventors: Masaaki Sadamori; Kenji Haze; Tosinori Katamine, all of Fukuoka, Japan

[73] Assignee: Mitsubishi Denki Kabushiki Kaisha, Japan

[21] Appl. No.: 392,552

[22] Filed: Aug. 11, 1989

[30] Foreign Application Priority Data

Dec. 20, 1988 [JP]  Japan .................................. 63-319484

[51] Int. Cl.$^5$ ............................................. C23C 14/34
[52] U.S. Cl. .............................. 204/192.12; 118/724; 118/725; 204/298.09
[58] Field of Search ..................... 204/192.12, 298.09; 118/724, 725

[56] References Cited

FOREIGN PATENT DOCUMENTS

| 0320016 | 6/1989 | European Pat. Off. ....... 204/298.09 |
| 59-113181 | 6/1984 | Japan ............................... 204/298.07 |
| 63-238266 | 10/1988 | Japan ............................... 204/298.09 |

*Primary Examiner*—Aaron Weisstuch
*Attorney, Agent, or Firm*—Leydig, Voit & Mayer

[57] ABSTRACT

The interior of a chamber within which a target assembly is disposed is evacuated to remove residual impurity gases while heated water flows within the target assembly. When the internal pressure within the chamber drops belows a predetermined level, cooled water flows within the target assembly, and a film is formed on a semiconductor substrate placed within the chamber as the target assembly is being cooled by the cooled water. Gases contained in the ambient atmosphere around the chamber are prevented from being introduced into the chamber when the interior of the chamber is opened. It is also possible to prevent any condensation of vapor on the target assembly.

6 Claims, 8 Drawing Sheets

VACUUM-FILM-FORMING APPARATUS AND METHOD

BACKGROUND OF THE INVENTION

1. Field of the Invention

The present invention relates to a vacuum film-forming apparatus and a method of application thereof. More particularly, the present invention relates to a vacuum film-forming apparatus such as a sputtering apparatus, a vacuum deposition apparatus, or an ion plating apparatus, and also to a vacuum film-forming method, in which cooling water is supplied to a target assembly to cool the target.

2. Description of the Related Art

FIG. 1 is a sectional view showing an example of a conventional vacuum film-forming apparatus, such as an aluminum sputtering apparatus. In FIG. 1, the apparatus has a chamber 1, and a target assembly 2 including an aluminum target 2a (shown in FIG. 2) disposed on a wall of the chamber 1. An argon gas source 3 is connected to the chamber to allow argon gas to be introduced therein. The amount and the pressure of the argon gas supplied are adjusted by means of a mass flow controller (MFC) 4 and regulators 5 and 6, respectively. The interior of the chamber 1 is evacuated roughly by means of a hydraulic rotary pump 7 while an evacuating valve 7a and a pump leak valve 7b are also being used. The interior of the chamber 1 is then kept at a high level of vacuum by means of a cryopump 8 while a foreline valve 8a is also being used. A conveyance pallet 10 is disposed within the chamber 1, and a semiconductor wafer 9, on which aluminum is to be sputtered, is placed upon the pallet 10. A throttle valve 11 and a gate valve 12 are connected to the cryopump 8 to allow the rate of evacuation to be controlled.

FIG. 2 shows the target assembly 2 in detail. Pipes 2c and 2d, and a cooling water baffle 2g are provided behind the aluminum target 2a so that cooling water may flow on the periphery of the aluminum target 2a as well as toward a magnet 2b. This arrangement ensures that the temperature of various parts of the target assembly 2 is prevented from rising to and is maintained below an unnecessarily high level. An iron casing 2f is disposed on the upper surface of the magnet 2b, and a cathode body 2e is disposed surrounding the casing 2f and the magnet 2b. The cathode body 2e is connected to a DC power source 2n.

The target assembly 2 also includes a dark space shield 2h, and an anode 2i. The aluminum target 2a is fixed to the cathode body 2e by a clamp ring 2j and is fastened by screws 2k. The target assembly 2 is mounted on a chassis 2m via an insulating plate.

The conventional aluminum sputtering apparatus having the above-described construction operates in the following manner. A semiconductor wafer 9 is inserted into the chamber 1 through a load lock chamber (not shown). Subsequently, the evacuating valve 7a is opened and the hydraulic rotary pump 7 is operated in such a manner as to maintain the interior of the chamber 1 in a vacuum condition at a level on the order of $10^{-3}$ Torr. After the evacuating valve 7a has been closed, the gate valve 12 and the foreline valve 8a are opened, and the cryopump 8 is operated in such a manner as to maintain the interior of the chamber in a vacuum condition at a high level of about $10^{-7}$ to $10^{-8}$ Torr. Thereafter, argon gas is introduced into the chamber 1 from the argon gas bomb 3 while the rate of evacuation by the cryopump 8 is adjusted by means of the throttle valve 11, in such a manner that the interior of the chamber 1 is maintained in a vacuum condition at a low level of about 1 to 30 mTorr.

Thereafter, when electric power of 1 to 3 kW is applied between the cathode body 2e and the anode ring 2i by the DC power source 2n, $Ar^+$ accelerated by the high voltage collides with the surface of the aluminum target 2a. As a result, aluminum particles of atom size are discharged from the aluminum target 2a and are then sputtered onto the semiconductor wafer 9.

During this action, part of the energy generated by the collision of $Ar^+$ is generated as heat. This heat, however, is by no means necessary for sputtering. Therefore, in order to protect the sputtering apparatus per se from the heat, cooling water is allowed to flow through the pipes 2c and 2d to the back of the target assembly 2, thereby water-cooling the assembly 2.

It is widely known that, in order to form good thin films, it is necessary to enhance the level of vacuum within the chamber 1. When it is desired to obtain a particularly good thin film, such as an aluminum thin film with only a very small number of hillocks, it is also necessary, in addition to eliminating any vacuum leakage, to thoroughly reduce residual impurity gases within the chamber 1, such as $H_2$, $H_2O$, $N_2$, and $O_2$. For this purpose, therefore, such impurities must be effectively removed.

With the conventional aluminum sputtering apparatus having the above-described construction, however, the following problem is encountered. When the chamber 1 is opened, there is a risk that certain gases contained in the ambient atmosphere around the chamber 1, particularly moisture, may be introduced into the chamber 1 and condense on and adhere to the surface of various cooled component parts such as the pipes 2c and 2d. During sputtering, the moisture thus introduced may evaporate or decompose into a gas, which may cause degradation of the quality of an aluminum thin film being formed.

SUMMARY OF THE INVENTION

The present invention has been accomplished in order to overcome the above-stated problem. It is an object of the present invention to provide a vacuum film-forming apparatus and a method of applying the same, which are capable of preventing the introduction of gases contained in the ambient atmosphere around the chamber when the chamber is opened, and are also capable of preventing any condensation of vapor on the target assembly.

In order to achieve the above objectives, according to one aspect of the present invention, there is provided a vacuum film-forming apparatus comprising: a chamber; a target assembly disposed within the chamber; pipes connected to the target assembly to supply water into the target assembly and discharge water therefrom; a tank connected to the pipes for storing water; cooling means provided in the tank and capable of cooling water within the tank to cool the target assembly during the operation of the vacuum film-forming apparatus; heating means disposed in the tank and capable of heating water within the tank to heat the target assembly during stoppage of the vacuum-film forming apparatus; means for circulating the cooled or heated water between the tank and the target assembly; and means for evacuating gas from within the chamber.

According to another aspect of the present invention, there is provided a vacuum film-forming method comprising the steps of: evacuating the interior of a chamber to remove residual impurity gases while heated water flows within a target assembly disposed within the chamber; and, when the internal pressure within the chamber drops below a predetermined level, subjecting a semiconductor substrate placed within the chamber to film formation while cooled water flows within the target assembly to cool the target assembly.

DESCRIPTION OF THE PREFERRED EMBODIMENTS

Figure 1:
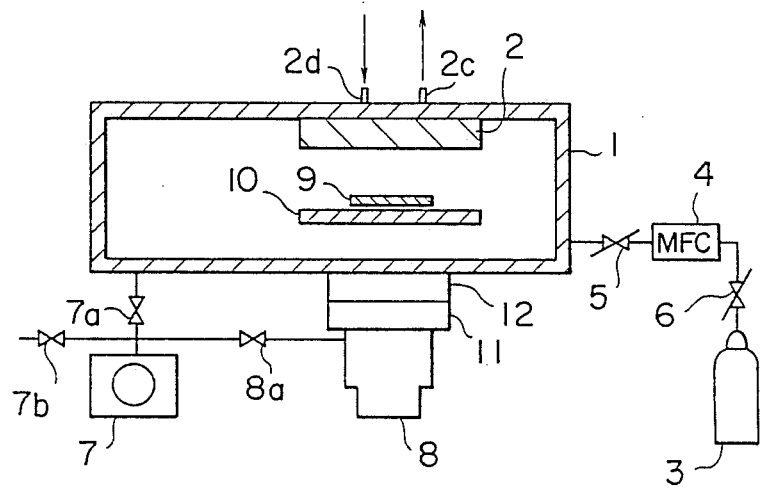
FIG. 1 is a view schematically showing an example of a conventional aluminum sputtering apparatus.
Figure 2:
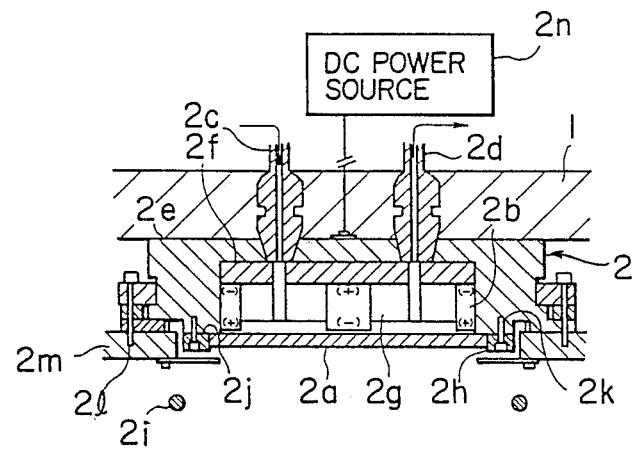
FIG. 2 is a sectional view of a target assembly.
Figure 3:
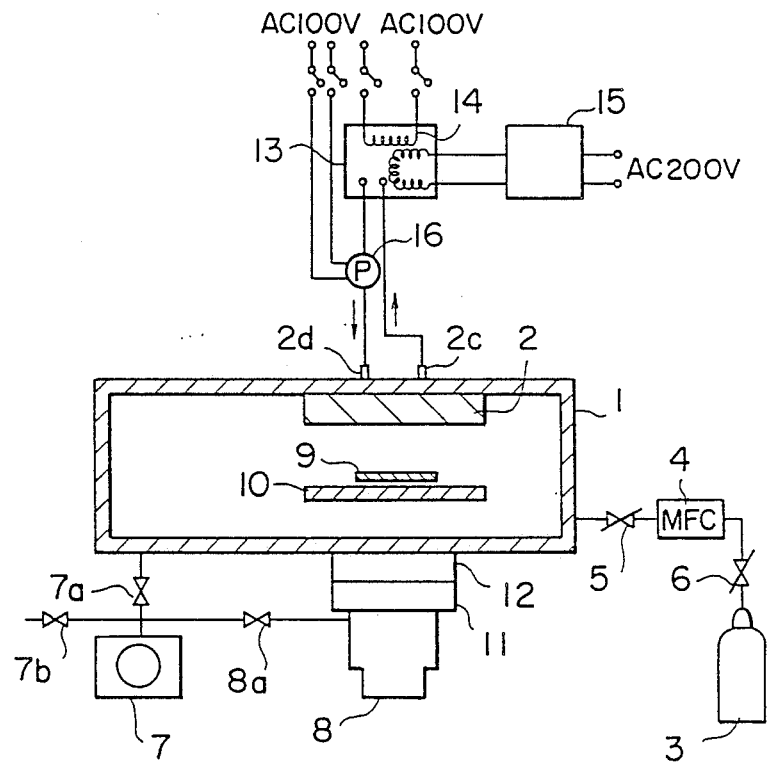
FIG. 3 is a view schematically showing an aluminum sputtering apparatus in accordance with one embodiment of the present invention.

Embodiments of the present invention will be described hereunder with reference to the drawings. FIG. 3 shows a first embodiment of the present invention. Component parts which are the same or correspond to those shown in FIGS. 1 and 2 are denoted by the same reference numerals, and explanations of those component parts will be omitted. Referring to FIG. 3, a tank 13 stores water which may be heated by a heater 14. It can be said from experience that it suffices if the water has a temperature of 60° C. or above, and the water need not be heated to its boiling point. The adoption of this condition is natural in the light of the principle that, if a baking out operation is effected while the interior of the chamber 1 is maintained under a reduced pressure, the boiling point of a liquid, water in this case, may not necessarily be 100° C. In contrast, in order to cool the water within the tank 13 to a temperature from 5° to 15° C., a cooling device 15 is connected to the tank 13. The water within the tank 13 is delivered to the target assembly 2 disposed within the chamber 1 by a magnetic pump 16 serving as the circulating means.

The aluminum sputtering apparatus having the above-described construction has the following arrangement. During the sputtering of aluminum, cooled water is supplied into the target assembly 2 disposed in the chamber 1 to adequately cool the periphery around the aluminum target 2a as well as other parts which need to be cooled. Subsequently, when the sputtering has been completed, the cooling device 15 is stopped, and the heater 14 is actuated to heat the water within the tank 13. The water thus heated flows into the target assembly 2. Thereafter, the interior of the chamber 1 is opened to the atmosphere, and various maintenance operations, such as the replacement of the aluminum target 2a, are performed. Subsequently, while heated water continues to flow, the chamber 1 is closed, and the interior of the chamber 1 is evacuated roughly, then evacuated normally. During this process, baking out is effected, whereby impurity gases within the chamber 1, such as moisture and air mixed therewith, are removed. After the baking out operation, the heater 14 is turned off, and the cooling device 15 is again actuated. In practice, however, it is possible to effect baking out even if no heated water flows when the chamber 1 is open to the atmosphere. Thus, the flow of heated water may not be necessarily caused during this period.

Figure 4:
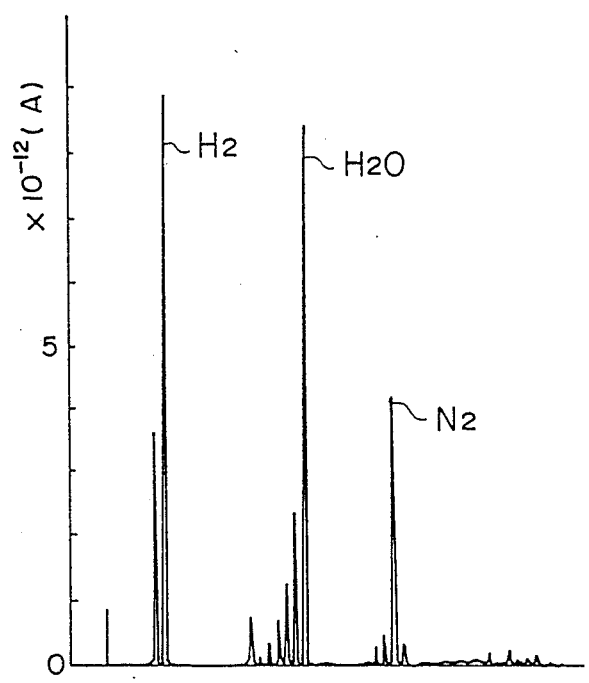
FIG. 4 is a graph showing the partial pressure of residual impurity gases before the start of a baking out operation.
Figure 5:
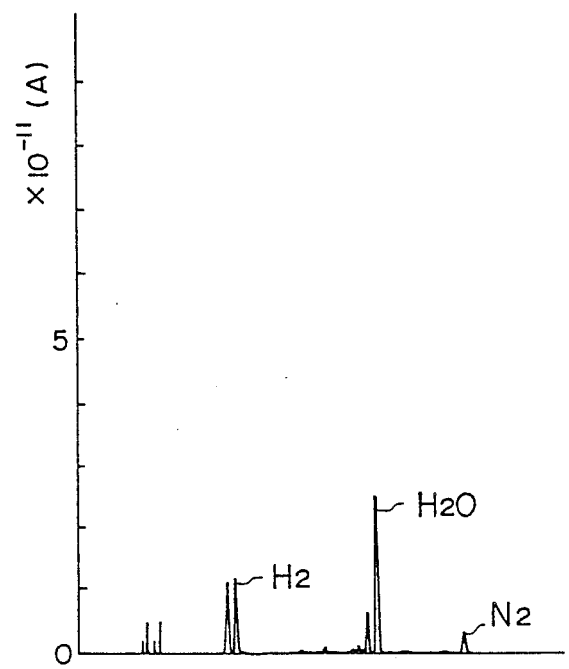
FIG. 5 is a graph showing the partial pressure of residual impurity gases during the baking out operation.

FIG. 4 shows values obtained by measuring, by means of quadrupole mass spectrography, the partial pressure of residual impurity gases before the start of a baking out operation. As shown in this figure, the partial pressure of $H_2O$ produced a current of $8.5 \times 10^{-12}$ Amps (A), that of $H_2$ produced $9.0 \times 10^{-12}$ A, and that of $N_2$ produced $4.3 \times 10^{-12}$ A. FIG. 5 shows the partial pressure of residual impurity gases which prevailed 30 minutes after the start of the baking out operation. As shown in this figure, the partial pressure increased rapidly: that of $H_2O$ produced $2.5 \times 10^{-11}$ A, that of $H_2$ produced $1.3 \times 10^{-11}$ A, and that of $N_2$ produced $0.5 \times 10^{-11}$ A. It will be understood from these results that the condensed substances were transformed into gases at very high speeds.

Figure 6:
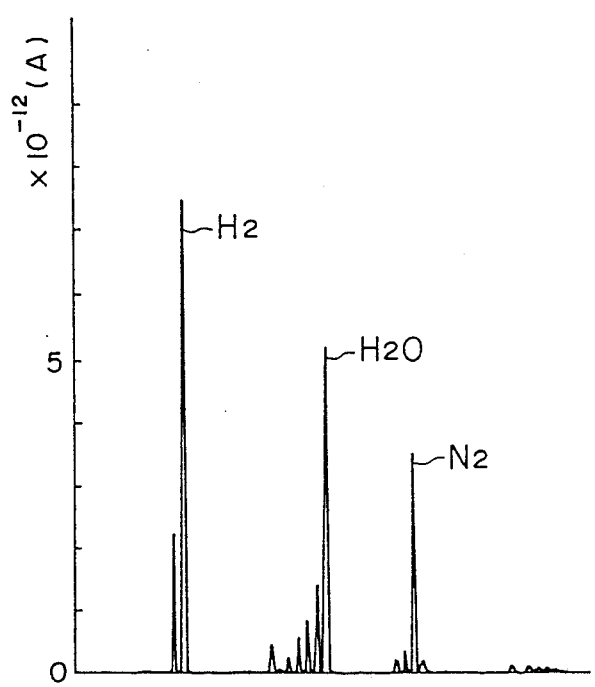
FIG. 6 is a graph showing the partial pressure of residual impurity gases after the baking out operation.

FIG. 6 shows the partial pressure of residual impurity gases which prevailed after the baking out operation had been effected for 2 hours. As shown in this figure, the partial pressure of $H_2O$ produced $5.2 \times 10^{-12}$ A, that of $H_2$ produced $7.5 \times 10^{-12}$ A, and that of $N_2$ produced $3.5 \times 10^{12}$ A. It will be understood from these results that considerable improvement from the condition before the baking out operation was achieved.

Figure 7:
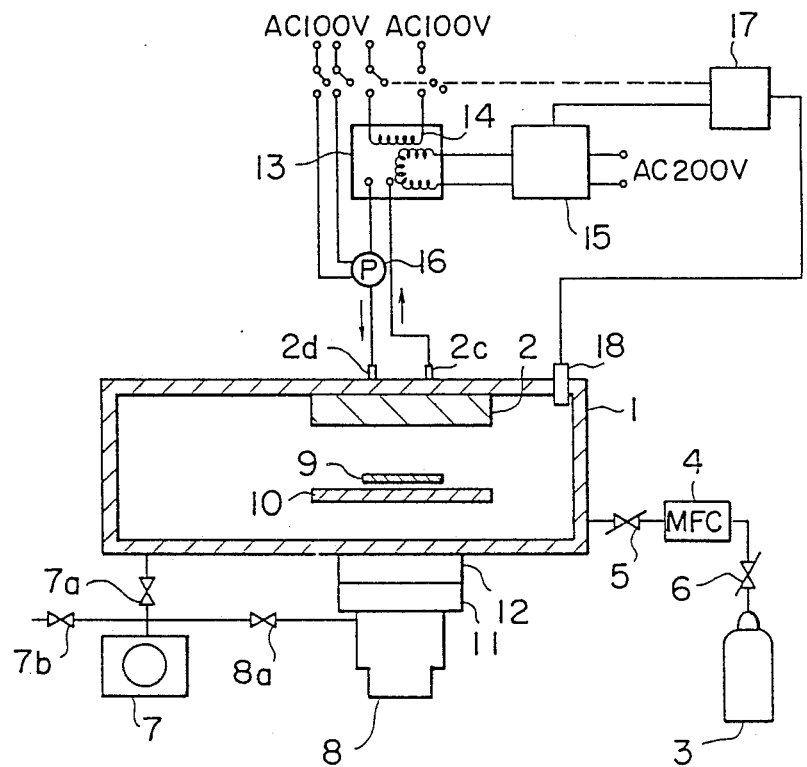
FIG. 7 is a view schematically showing an aluminum sputtering apparatus in accordance with another embodiment of the present invention.

FIG. 7 shows an aluminum sputtering apparatus in accordance with another embodiment of the present invention. Reference numerals 1 to 16 denote the same component parts as those of the apparatus shown in FIG. 3. The aluminum sputtering apparatus shown in FIG. 7 is distinguished in that it includes an automatic switching controller 17, and a pressure sensor 18 mounted on the chamber 1.

This aluminum sputtering apparatus has the following arrangement. During vacuum drawing, the pressure sensor 18 is in its off-state. A signal indicative of this state is transmitted to the automatic switching controller 17 connected to the sensor 18. The controller 17 causes the operation of the cooling device 15 whereby water within the tank 13 is cooled, and also causes the magnetic pump 16 to operate whereby the cooled water is circulated between the target assembly 2 and the tank 13.

During the time when the chamber 1 is open to the atmosphere for the replacement of the aluminum target 12 and other maintenance operations, the pressure sensor 18 is in its on-state. A signal indicative of this state is transmitted to the automatic switching controller 17 which then stops the cooling device 15. The controller 17 also supplies electric power to the heater 14 whereby water within the tank 13 is heated, and also causes the magnet pump 16 to operate whereby the heated water is circulated between the target assembly 2 and the tank 13. By this operation, moisture or the like contained in the ambient atmosphere around the chamber 1 is prevented from being introduced into the chamber 1.

Figure 8:
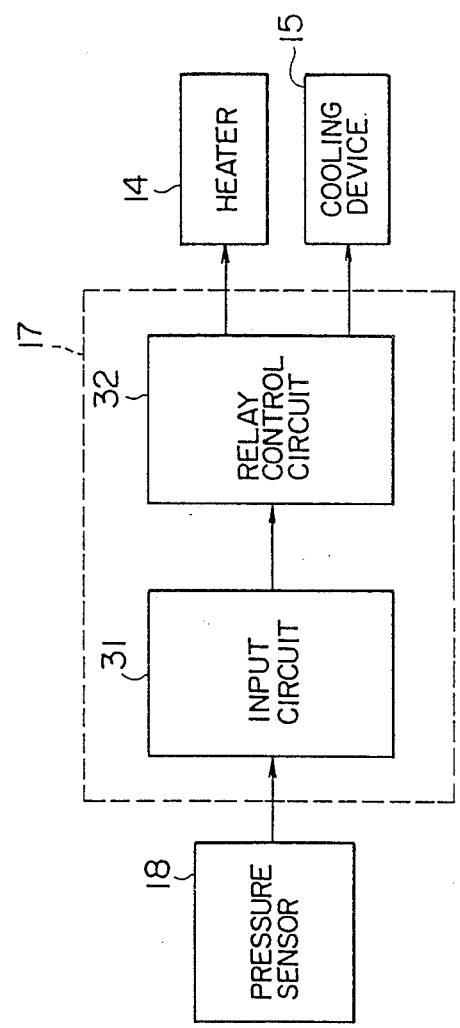
FIG. 8 is a block diagram showing the electric circuit of the aluminum sputtering apparatus shown in FIG. 7.
Figure 9:
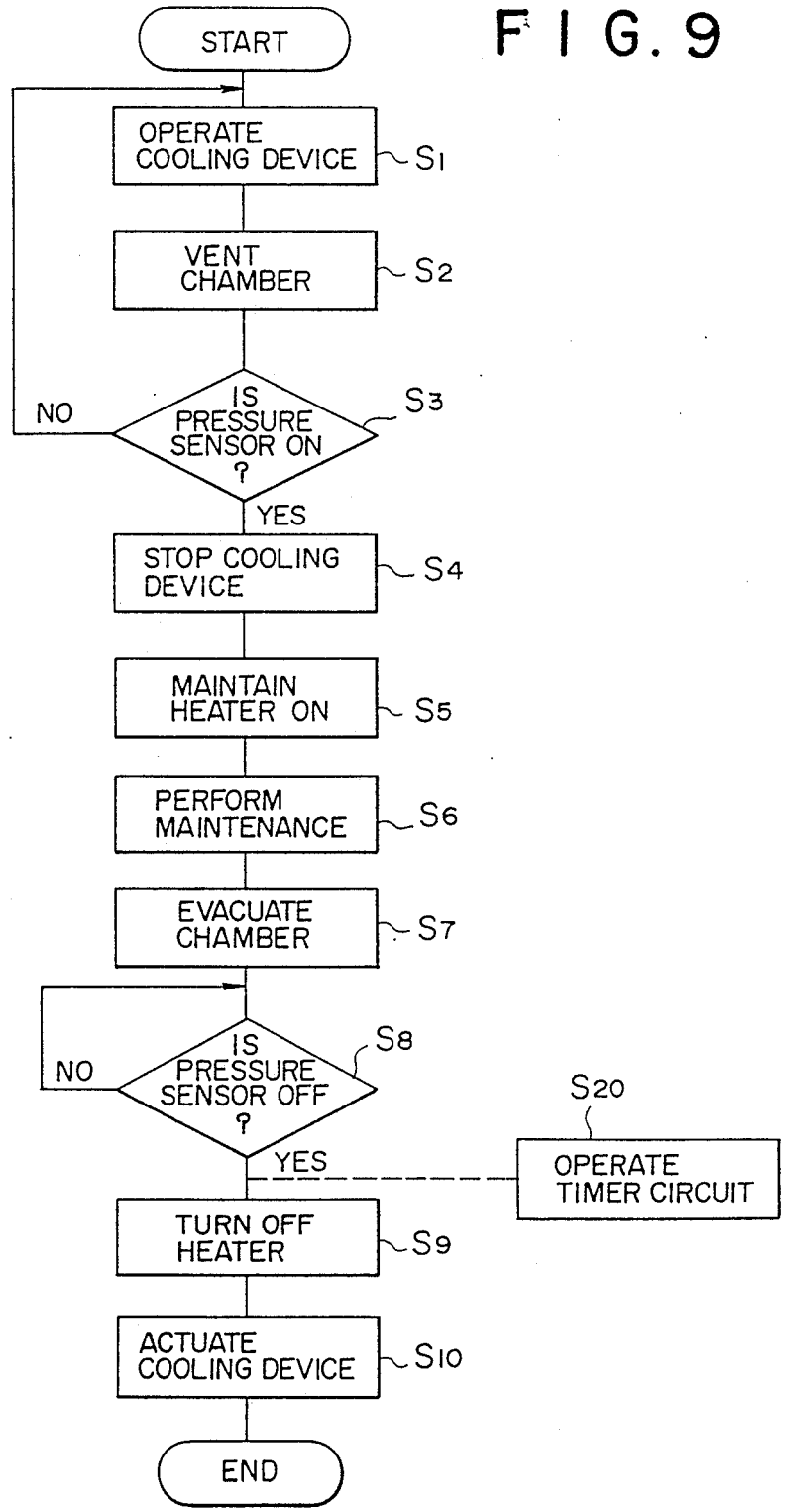
FIG. 9 is a flowchart showing the operation of the aluminum sputtering apparatus shown in FIG. 7.

Next, the operation of the apparatus in accordance with this embodiment will be described with reference to FIGS. 8 and 9. FIG. 8 is a block diagram showing a circuit for cooling and heating control, and FIG. 9 is a flowchart showing the control operation performed by the apparatus. During the normal state of the apparatus, the cooling device 15 is operated (Step $S_1$). Thereafter, when it is necessary to perform various maintenance operations with respect to the interior of the chamber 1, such as the replacement of the aluminum target 2a, a chamber venting operation is effected in which the interior of the chamber 1 is supplied with $N_2$ (Step $S_2$). When the internal pressure within the chamber 1 reaches atmospheric pressure, the pressure sensor 18 generates an on-signal that is introduced into an input circuit 31 of the automatic switching controller 17 (Step $S_3$). The input circuit 31 processes the on-signal so that, when a relay control circuit 32 is supplied with the resultant signal, the circuit 32 stops the cooling device (Step $S_4$), actuates, and maintains the heater 14 in its on-condition (Step $S_5$). After maintenance has been performed in Step $S_6$, the chamber 1 is evacuated (Step $S_7$). When the internal pressure within the chamber 1 drops to a certain level, the pressure sensor 18 generates an off-signal (Step $S_8$). This off-signal is introduced into the input circuit 31. After the off-signal has been processed by the input circuit 31, it is supplied to the relay control circuit 32 which then operates to turn off the heater 14 (Step $S_9$) and also to again actuate the cooling device (Step $S_{10}$). In this way, on the basis of the on/off condition of the pressure sensor 18, cooled water and heated water are switched automatically.

In the above-described embodiment, automatic operation causes moderately warm or considerably warm water to flow only when the internal pressure within the chamber 1 is in an atmospheric pressure condition. However, an additional automatic operation may be performed by providing a timer circuit in a step $S_{20}$ inserted between the steps $S_8$ and $S_9$, so that the baking out of the interior of the chamber 1 in its vacuum condition is effected for a desired period of time.

Although each of the foregoing embodiments concerns an aluminum sputtering apparatus, the present invention is not limited thereto. It would be naturally understood that the present invention may be applied to the baking out of a vacuum film-forming apparatus of another kind, such as a vacuum deposition apparatus, or an ion plating apparatus. It would also be naturally understood that the present invention may be applied to the sputtering of a substance which is not aluminum, for instance, the sputtering of a metal such as titanium, gold, silver, or copper, or an insulator such as $SiO_2$.

What is claimed is:

1. A vacuum film-forming apparatus comprising:
   a chamber;
   a target assembly disposed within said chamber;
   pipes connected to said target assembly for supplying water to said target assembly and discharging water therefrom;
   a tank for storing water connected to said pipes;
   cooling means disposed in said tank for selectively cooling water within said tank to selectively cool said target assembly;
   heating means disposed in said tank for selectively heating water within said tank to selectively heat said target assembly;
   means for circulating the water between said tank and said target assembly through said pipes; and
   means for evacuating said chamber.

2. An apparatus according to claim 1 comprising a pressure sensor mounted within said chamber for measuring the internal pressure within said chamber and generating an electrical signal indicative of the measured pressure; and
   means electrically connected to said pressure sensor for automatically actuating said cooling means and said heating means in response to the signal generated by said pressure sensor.

3. A method of depositing a film on a substrate with material transferred from a water-cooled target assembly disposed in a vacuum chamber, comprising:
   evacuating the chamber to remove residual impurity gases while heating the target assembly with a flow of heated water; and
   after the internal pressure within said chamber drops below a predetermined level, cooling the target assembly with a flow of cooled water and transferring material from the target assembly to the substrate disposed within said chamber to deposit said film on the substrate while the target assembly is being cooled by the cooled water.

4. A vacuum film-forming method according to claim 3 comprising, after depositing the film, heating the target assembly with a flow of heated water, opening the chamber to the ambient atmosphere;
   replacing the substrate on which a film has been deposited with a second substrate;
   closing the chamber;
   evacuating the chamber to remove the residual impurity gases remaining within said chamber while heating the target assembly with a flow of heated water; and
   after the internal pressure with said chamber drops below a predetermined level, transferring material from the target assembly to the second substrate while the target assembly is being cooled by the cooled water.

5. A method according to claim 4 wherein heated water is supplied to the target assembly when the chamber is open to the ambient atmosphere.

6. A method according to claim 4 comprising after the internal pressure within said chamber has dropped below said predetermined level, baking out the chamber for a predetermined period of time while evacuating the chamber.

* * * * *